United States Patent [19]

Kawakami et al.

[11] Patent Number: 5,226,523
[45] Date of Patent: Jul. 13, 1993

[54] CONVEYING APPARATUS AND METHOD OF CONTROLLING THE SAME

[75] Inventors: Eigo Kawakami, Ebina; Koji Uda, Yokohama; Kunitaka Ozawa, Isehara; Shunichi Uzawa, Tokyo; Mitsutoshi Kuno, Sagamihara; Kazunori Iwamoto, Yokohama; Takao Kariya, Hino, all of Japan

[73] Assignee: Canon Kabushiki Kaisha, Tokyo, Japan

[21] Appl. No.: 963,517

[22] Filed: Oct. 20, 1992

Related U.S. Application Data

[63] Continuation of Ser. No. 587,106, Sep. 24, 1990, abandoned.

[30] Foreign Application Priority Data

Sep. 26, 1989 [JP] Japan ................. 1-248142

[51] Int. Cl.⁵ ............................................. B65G 43/00
[52] U.S. Cl. ............................. 198/341; 198/468.9
[58] Field of Search ............. 198/341, 340, 468.4, 198/468.9

[56] References Cited

U.S. PATENT DOCUMENTS

| | | | |
|---|---|---|---|
| 3,695,461 | 10/1972 | Ginther | 198/341 |
| 3,845,286 | 10/1974 | Aronstein et al. | 198/341 X |
| 4,027,246 | 5/1977 | Caccoma et al. | |
| 4,507,078 | 3/1985 | Tam et al. | 198/341 X |
| 4,836,733 | 6/1989 | Hertel et al. | 198/341 X |
| 4,854,444 | 8/1989 | Iwamoto | 198/750 |

FOREIGN PATENT DOCUMENTS

| | | |
|---|---|---|
| 0477394 | 10/1975 | U.S.S.R. |
| 0751727 | 7/1980 | U.S.S.R. |
| 0779201 | 11/1980 | U.S.S.R. |
| 2096797 | 10/1982 | United Kingdom |

OTHER PUBLICATIONS

"Specifications: Programmable Single-Chip High-Speed Pulse Generator PCL-240K," Nippon Pulse Motor Co., Ltd. (date unknown).
"A Microprocessor-Based Architecture for E-Beam Wafer Transfer System," IEEE International Electronic Manufacturing Technology Symposium, by T. Landon, et al., pp. 145-148, Sep. 15, 1986.

Primary Examiner—D. Glenn Dayoan
Attorney, Agent, or Firm—Fitzpatrick, Cella, Harper & Scinto

[57] ABSTRACT

A conveying apparatus includes a plurality of position limiting devices provided along the direction of conveyance and a selecting device operable to select one of or those of the plurality of position limiting devices which are effective in view of a target position, before a start of conveyance. The selecting device is further operable to select, again, one of or those of the plurality of position limiting devices which are effective in view of the current position of an article being conveyed, after a start of conveyance.

10 Claims, 6 Drawing Sheets

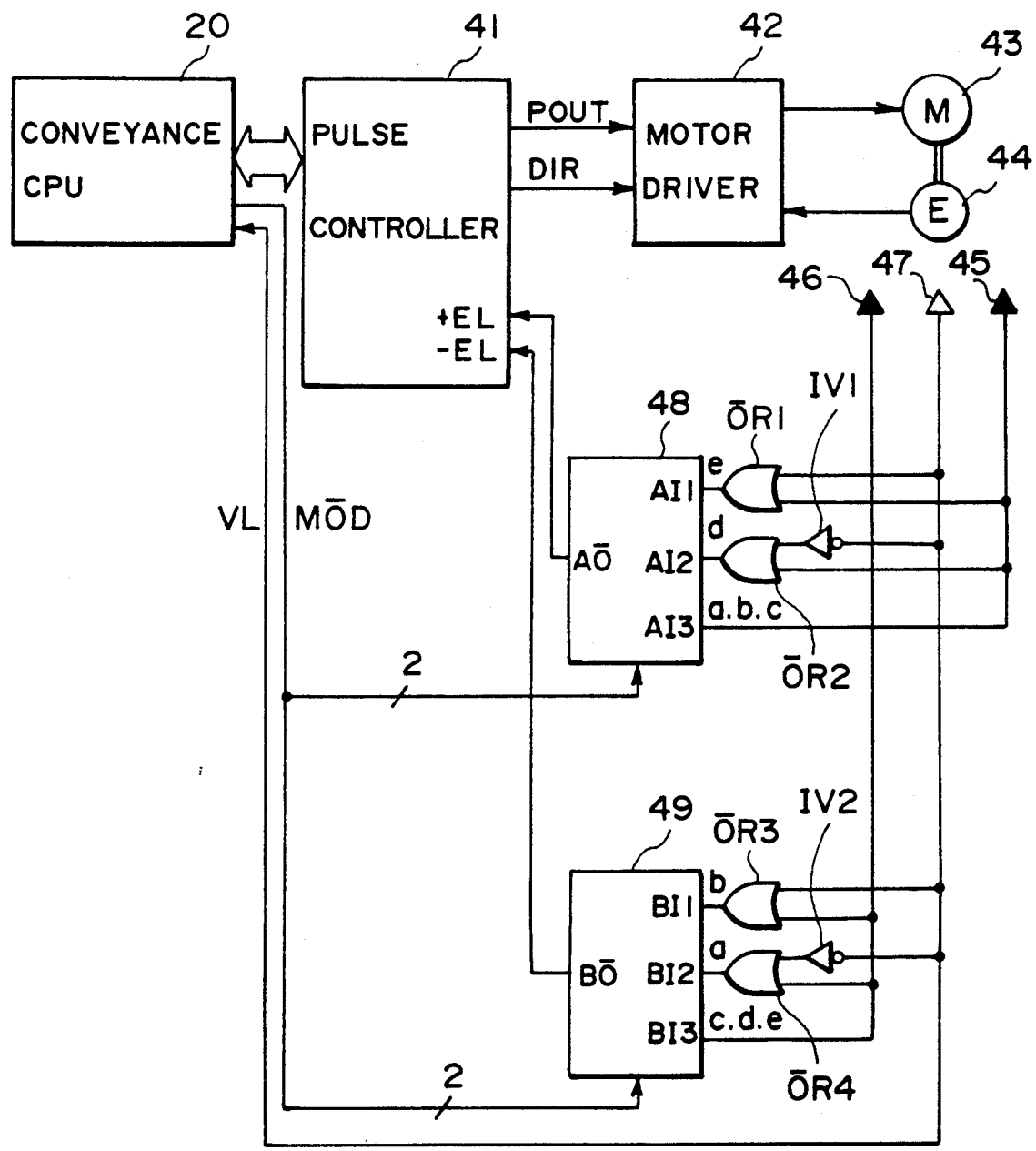
F I G. 4

CONVEYING APPARATUS AND METHOD OF CONTROLLING THE SAME

This application is a continuation of application Ser. No. 587,106 filed Sep. 24, 1990, now abandoned.

FIELD OF THE INVENTION AND RELATED ART

This invention relates to a conveying apparatus and method of controlling the same, suitably usable in a semiconductor device manufacturing apparatus such as an exposure apparatus, for example, for conveyance of a wafer or a mask.

Generally, a system for conveying or positioning an article, to be conveyed, through a motor drive is equipped with position limiting means at the opposite ends of its conveyance stroke in consideration of possible malfunction (run-away) of a program for controlling the conveyance or the positioning.

FIG. 2 is a block diagram of an exemplary conveying apparatus and FIG. 3 illustrates such a conveying apparatus which is applied to a vertical type wafer conveying system to be used in an X-ray exposure apparatus that uses synchrotron orbit radiation (SOR) light.

In these drawings, reference numeral 20 denotes a conveyance central processing unit which controls the conveying system of the exposure apparatus as a whole, in response to instructions supplied from a main-part central processing unit (not shown) of the exposure apparatus. Reference numeral 21 denotes a pulse controller such as "PCL-240K" available from Nippon Pulse Motor Co., Japan, for example, which produces a rotating direction signal DIR and a pulse train POUT, necessary for the rotation of a motor 23, and applies them to a motor driver 22, in response to instructions supplied from the conveyance CPU 20. Denoted at 24 is an encoder for feeding the amount of rotation of the motor 23 back to the motor driver 22.

Non-painted small triangles at A-D in FIG. 3 denote position sensors (position discriminating means) to be used for discrimination, through the conveyance CPU 20, of completion of conveyance of the conveying apparatus to a desired position. Also, painted small triangles at 25 and 26 denote sensors (limit sensors) of the position limiting means, which sensors communicate with corresponding signal input terminals +EL and −EL of the pulse controller 21. In response to an input to the pulse controller 21 from the limit sensor 25 or 26, the output of the POUT signal which is the pulse output of the controller 21 to the motor driver 22, is prohibited by hardware logic, whereby the overrunning of the conveying apparatus in the corresponding direction is prevented. This is one of the functions of the pulse controller 21 which is independent of the control program, and hereinafter this will be called an "end limit function".

Denoted at 30 is a wafer hand for holding a wafer 1 by vacuum attraction, for example. Denoted at 31 is a supporting member for the wafer hand 30, which member is driven by a ball screw 33, coupled to the shaft of the motor 23 through a coupling 32, to convey the wafer 1 held by the wafer hand 30 in the Z-axis direction. Denoted at 34 are guide members for the supporting member 31, and denoted at 35 are stationary members for securely fixing the conveying apparatus at a predetermined position in the exposure apparatus. Denoted at 36 is a light blocking plate for the position sensors A-D and the limit sensors 25 and 26, each comprising a photosensor. Denoted at 37 is a stage having a wafer chuck of vacuum attraction type, for example, and being movable in the x-axis and y-axis directions. With respect to the z-axis direction, it is positioned between the position sensors C and D.

The operation of the wafer conveying system of the structure described above, will now be explained. First, for the wafer transfer from the wafer hand 30 to the stage 37, the stage 37 is moved in the x-axis and y-axis directions to the position shown in FIG. 3. Then, the conveyance CPU 20 supplies an instruction signal to the pulse controller 21. In response, the pulse controller 21 supplies to the motor driver 22 a DIR signal in the −z direction as well as a POUT signal which comprises pulses of a number necessary for moving the wafer hand supporting member 31 from the position sensor A to the position sensor C. In response to these signals, the motor 23 rotates in the designated direction by a designated amount, whereby the wafer hand supporting member 31 is moved from the position of the position sensor A to the position of the position sensor C and whereby the wafer 1 held by the wafer hand 30 is moved to a position just before the wafer chuck surface of the stage 37.

Then, the attraction of the wafer by the wafer chuck of the stage 37 starts, and in a similar manner the wafer hand supporting member 31 is moved from the position of the position sensor C to the position of the position sensor D. Here, if a vacuum sensor (not shown) of the stage 37 detects the condition for attraction, the vacuum attraction by the wafer hand 30 is stopped. Then, the wafer hand supporting member 31 is moved from the position of the position sensor D to the position of the position sensor B and, by spacing the back of the wafer 1 and the wafer hand 30, the wafer transfer from the wafer hand 30 to the stage 37 is completed. After this, the stage 37 is moved in the x-axis and y-axis directions for preparation for the next step (e.g., an alignment step).

Next, the wafer transfer from the stage 37 to the wafer hand 30, will be explained. It is assumed that the wafer hand supporting member 31 is at the position of the position sensor B. First, the stage 37 having the wafer 1 attracted thereto is moved in the x-axis and y-axis directions, to the position shown in FIG. 3. Then, in a similar manner as described, the wafer hand supporting member 37 is moved from the position of the position sensor B to the position of the position sensor D, such that the wafer hand 30 is moved close to the back of the wafer 1. Then, the vacuum attraction of the wafer by the wafer hand 30 is started, and the wafer hand supporting member 31 is moved from the position of the position sensor D to the position of the position sensor C. Here, if the vacuum sensor (not shown) of the wafer hand 30 detects the condition for attraction, the attraction by the stage 37 is stopped. Finally, the wafer hand supporting member 31 is moved from the position of the position sensor C to the position of the position sensor A, to complete the wafer transfer from the stage 37 to the wafer hand 30.

SUMMARY OF THE INVENTION

Generally, in such a conveying system, for enhanced throughput of the exposure apparatus, highspeed conveyance based on what can be called a "trapezoidal speed pattern" is effected at an acceleration and deceleration rate, avoiding dropping of the wafer, for conveyance between the position sensors A and C and between the position sensors D and B, whereas constant low speed driving is effected for the conveyance between the position sensors C and D for the mounting-/demounting of the wafer. In this case, for the driving in the direction from the sensor C to the sensor A or from the sensor D to the sensor B, if the wafer hand supporting member 31 does not stop at the position of the position sensor A or B due to runaway of the program or for any other reason, it is detected by the limit sensor 25 or 26 such that the pulse output from the pulse controller 21 is stopped. Therefore, the wafer hand supporting member 31 does not collide against the stationary member 35 in the corresponding direction.

However, for the driving in the direction from the position sensor A to the sensor C or in the direction from the position sensor B to the sensor D, such a limit sensor is not provided. Therefore, if the supporting member does not stop at the position of the position sensor C or D, there is a possibility of collision of the wafer 1 against the stage 37 or the wafer hand 30. This is a serious problem because, in a vertical type conveying system such as shown in FIG. 3, not only does it directly result in dropping of the wafer or damage of the same, but it also causes damage of the conveying apparatus itself in some cases.

The present invention has been made in consideration of these problems, and it is an object of the present invention to provide a conveying apparatus and a method of controlling the same, in accordance with which the set position of position limiting means can be changed and in accordance with which an article to be conveyed or the conveying apparatus itself is not damaged even if runaway of the conveying apparatus occurs.

In accordance with an aspect of the present invention, to achieve the above object, a plurality of position limiting means are provided along the conveying direction, and before start of conveyance one of or those of the position limiting means which are effective in accordance with a target position (destination) of the conveyance, are selected. After start of the conveyance, one of or those of the position limiting means which are effective in accordance with the position of the article, being conveyed, are selected again.

With this arrangement, it is possible to obtain a conveying apparatus of high reliability, in which damage of an article to be conveyed or of the conveying apparatus itself can be avoided, even if runway or malfunction of the conveying apparatus occurs.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a block diagram of a conveying apparatus according to an embodiment of the present invention.

DESCRIPTION OF THE PREFERRED EMBODIMENTS

Figure 1:
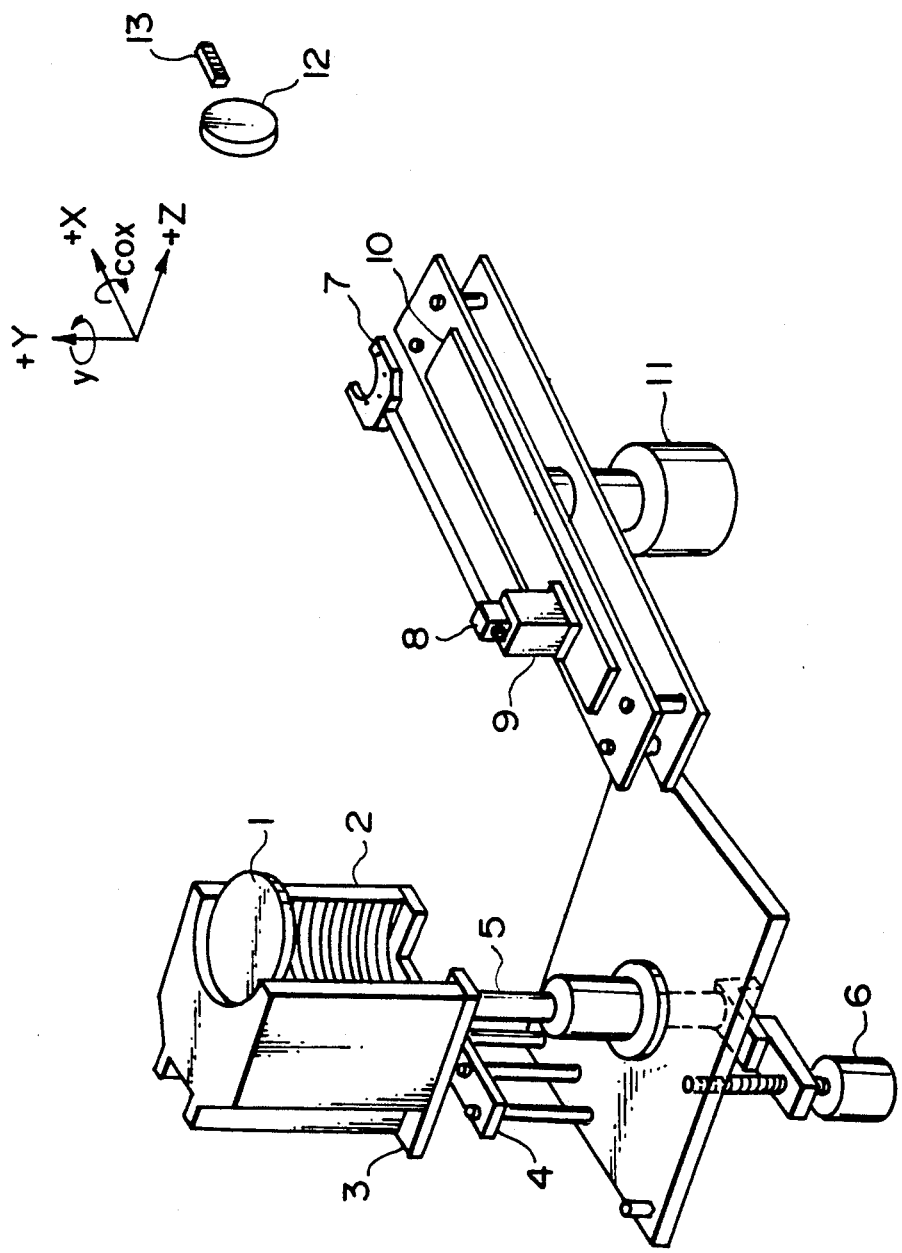
FIG. 1 is a perspective view schematically showing a wafer conveying apparatus according to the present invention.

FIG. 1 illustrates a wafer conveying system in an X-ray exposure apparatus, to which the present invention is applied. In FIG. 1, denoted at 1 is a wafer; at 2 is a wafer carrier for accommodating therein plural wafers such as at 1, for example; at 3 is a wafer carrier table on which the wafer carrier 2 is placed; at 4 is a wafer sensor for detecting presence/absence of a wafer in the wafer carrier 2; and at 5 is an elevator rod which is coupled to the carrier table 3 and is adapted to be moved in the y-axis direction (vertical direction) by means of a motor 6. The components 3 - 6 constitute a wafer carrier elevator.

Denoted at 7 is an ejector hand for holding a wafer by vacuum attraction; at 8 is an actuator for rotating the ejector hand 7 in the wx direction (about the x-axis) as illustrated, which actuator is driven by means of a vane motor, for example. Denoted at 9 is a Z stage which bears the actuator 8 and which is movable in the z-axis direction; at 10 is an X stage which bears the Z stage 9 and which is movable in the z-axis direction; and at 11 is a motor, comprising a direct drive servo motor (DD motor), for example, which supports the X stage at the center of its stroke and which is rotatable in the wy direction (about the y-axis). The components denoted at 7-11 constitute a wafer ejector.

Denoted at 12 is a stage which includes a wafer chuck for holding the wafer 1 by vacuum attraction and which is movable in the x-axis and y-axis directions. Denoted at 13 is a sensor for detecting the position of the wafer in the x-axis direction when the wafer is to be transferred from the ejector to the stage 12. The sensor 13 comprises a one-dimensional position detecting element such as, for example, a CCD line sensor disposed parallel to the x-axis direction.

Now, explanation will be made of the operation for conveying a wafer 1 in the wafer carrier 2 to the stage 12, in the wafer conveying apparatus of the structure described above. First, the motor 6 is driven to move the carrier table 3 downwardly along the y-axis direction, until the wafer 1 in the wafer carrier 2 is brought to a predetermined taking-out position (height). Here, through one operation, the motor 6 is driven by an amount corresponding to one pitch of the wafer accommodating shelves of the wafer carrier 2 and, each time the motor 6 is driven by that amount, the wafer sensor 4 discriminates whether the wafer 1 has come to the predetermined position. If the arrival is discriminated, the DD motor 11 is driven to rotate the X stage 10 in the wy direction, so that the ejector hand 7 is opposed to the wafer carrier 2 (in this case, the X stage 10 can be moved in the z-axis direction, but it is still called an "X stage", for convenience in explanation).

Subsequently, the X stage 10 is moved in the −z direction to move the ejector hand 7 to the back of the wafer 1. Then, the attraction through the ejector hand 7 is started and, by the actuation of the motor 6, the wafer carrier 2 is moved downwardly through one pitch in a similar manner as described. Here, after a vacuum sensor (not shown) of the ejector hand 7 discriminates the attraction, the X stage 10 is moved in the +z direction to move the ejector hand 7, holding the wafer 1 by attraction, out of the wafer carrier 2. Then, the DD motor 11 is actuated to rotate the X stage 10 toward the stage 12 (the state shown in FIG. 1).

Subsequently, the actuator 8 is driven to rotate the ejector hand 7 clockwise by 90 degrees, toward the +x direction, so that the ejector hand 7 and the wafer 1, held by the ejector hand 7, become parallel to the attracting surface of the stage 12 which is substantially parallel to the X-Y plane. Then, the X stage 10 is driven in the +x direction to move the ejector hand 7 so that the edge of the wafer 1, which can be detected by the line sensor 13, comes to a predetermined position with respect to the x-axis direction (i.e. the position by which the center of the attracting surface of the stage 12 and the center of the wafer 1 are substantially coincident with each other, on the X-Y plane).

Finally, the attraction by the stage 12 is started, and the Z stage 9 is moved in the −z direction, for transfer of the wafer 1 from the ejector hand 7 to the stage 12 (to be described later in detail). Then, the X stage 10 is driven in the −x direction to move the ejector hand 7 backwardly and, after this, the Z stage 9 is driven in the +z direction and the actuator 8 is rotated counterclockwise by 90 degrees toward the +z direction, whereby the conveyance of the wafer 1 from the wafer carrier 2 to the stage 12 is completed.

On an occasion where the stage 12 is a prealignment stage, the completion of conveyance is followed by an operation, called an "orientation flat detection", for aligning a cut-out portion (orientation flat) of the wafer 1 with respect to a predetermined direction and, thereafter, the wafer is conveyed to a separate stage for the exposure operation, by a separate wafer conveying system.

Figure 5:
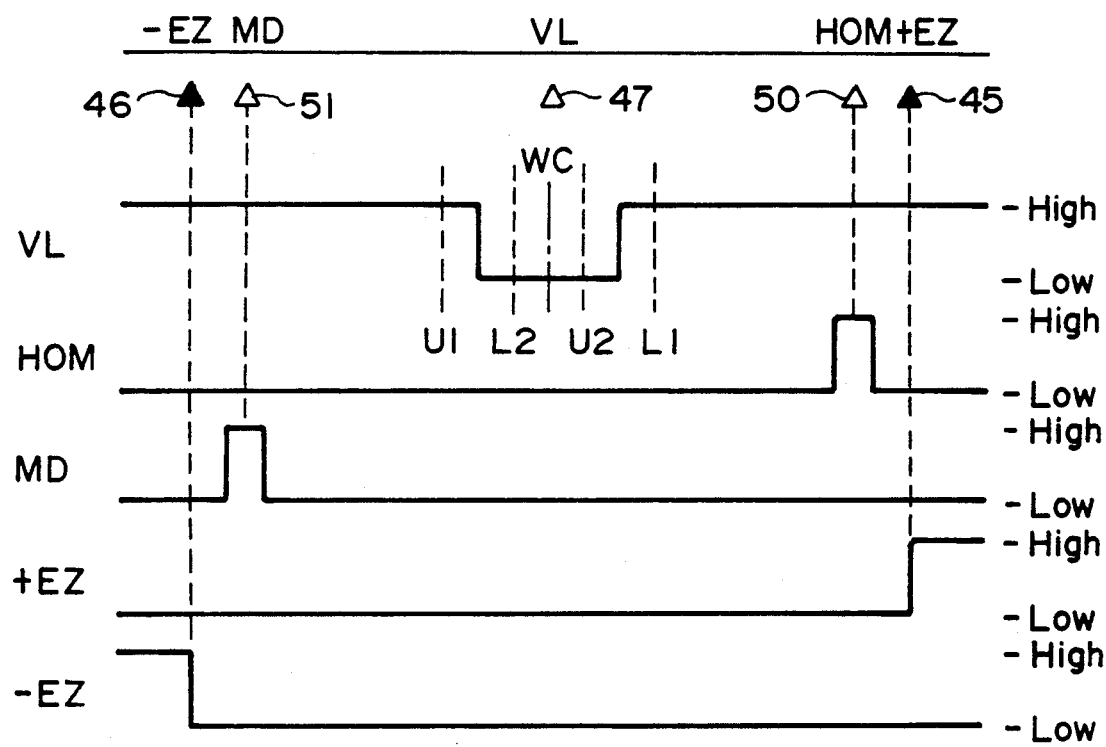
FIG. 5 is a schematic representation, explaining the disposition of sensors in the conveying apparatus of FIG. 4.
Figure 6:
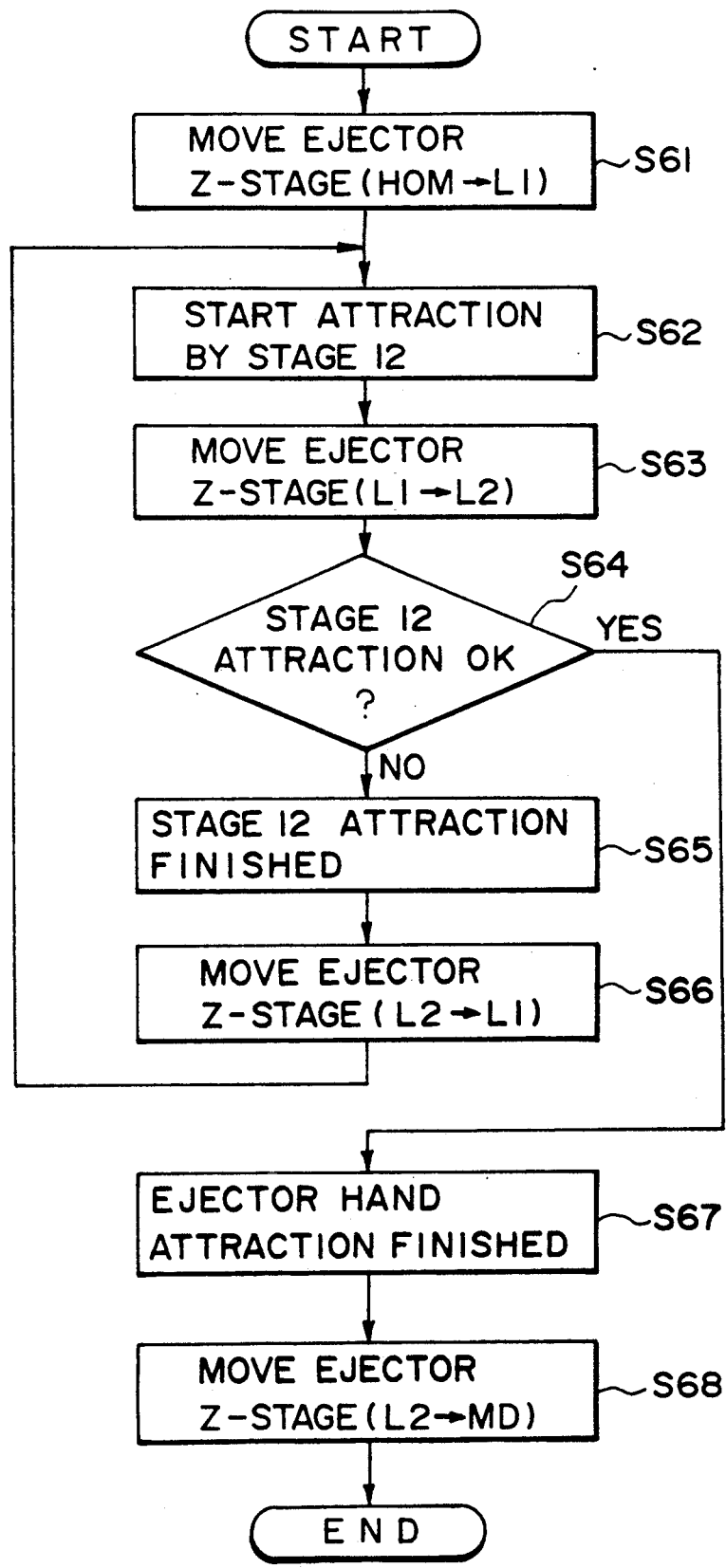
FIG. 6 is a flow chart, for explaining the control to be made in the conveying apparatus of FIG. 4.
Figure 7:
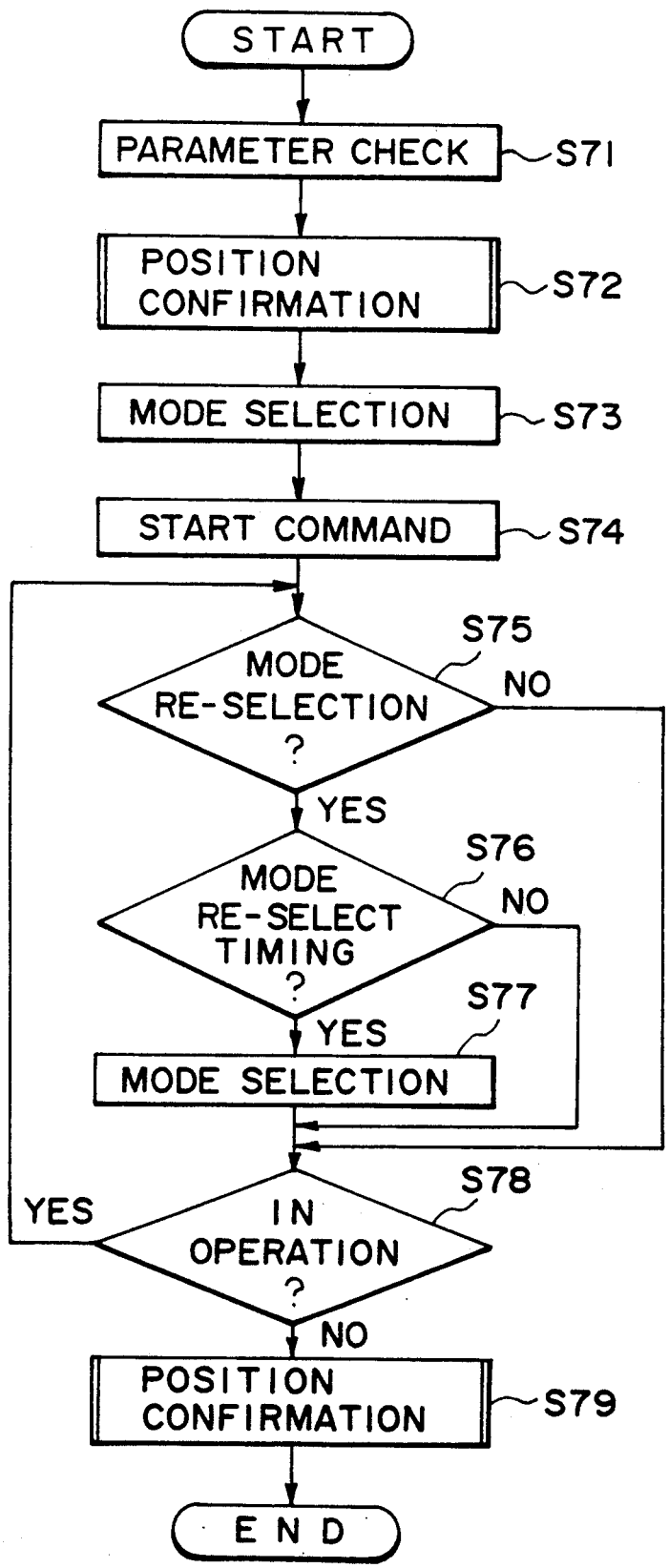
FIG. 7 is a flow chart, showing details of a part of FIG. 6.

FIG. 4 illustrates an embodiment of the present invention and is a block diagram of an electric system of the Z stage 9 of the ejector shown in FIG. 1. FIG. 5 is a schematic view showing disposition of the sensors (in the z-axis direction) of the stage 9. FIG. 6 is a flow chart for the transfer of a wafer from the ejector hand 7 to the stage 12, by using the stage 9. FIG. 7 is a flow chart showing details of a part of FIG. 6.

Figure 2:
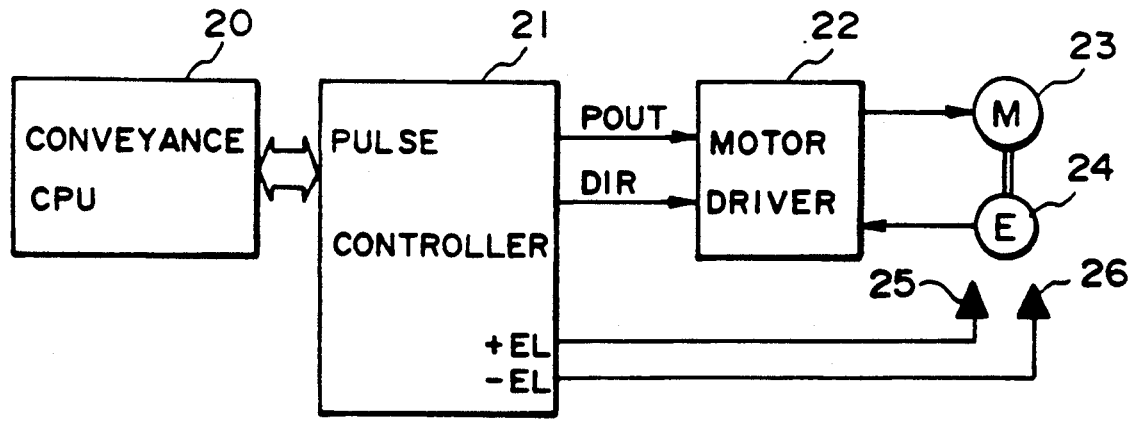
FIG. 2 is a block diagram of an exemplary conveying apparatus.
Figure 3:
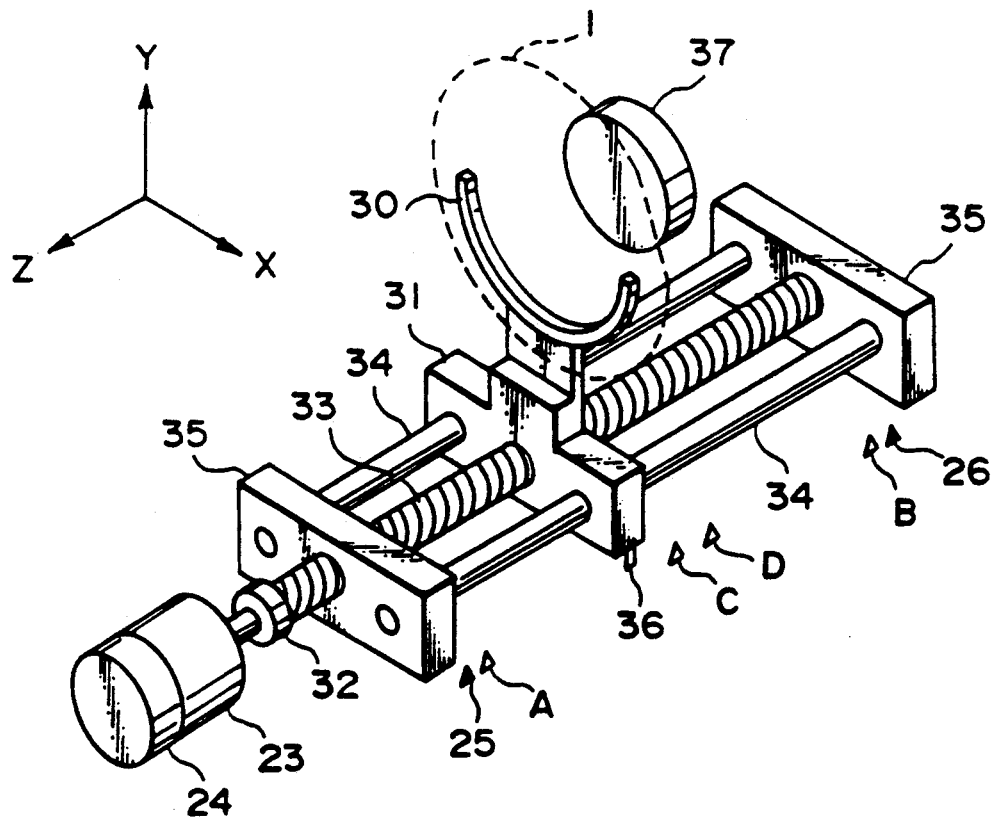
FIG. 3 is a perspective view schematically showing an exemplary wafer conveying apparatus.

In FIG. 4, the elements denoted at 41 - 46 correspond to the elements denoted at 21 - 26 shown in FIG. 2 and, therefore, further explanation is omitted here. Denoted at 47 is a position sensor for detecting whether or not the z-axis position of the ejector hand 7 of FIG. 1 is close to the chuck surface of the stage 12. In this embodiment, this sensor also functions as a position limiting means, to be described later. Denoted at 48 and 49 are changeover switches each comprising a logic cell array, for example. In response to a MOD signal from the conveyance CPU 20, the switches 48 and 49 apply their inputs at AI1-AI3 and BI1-BI3 to AO and BO, respectively. Characters a-e denote the selectable modes. At the switch 48, if the modes a, b and c are selected, for example, the input AI3 is connected to AO. If the mode d is selected, the input AI2 is connected to AO. If the mode e is selected, the input AI1 is connected to AO. In the switch 49, if the mode a is selected, the input BI2 is connected to BO. If the mode b is selected, the input BI1 is connected to BO. In the modes c, d and e, the input BI3 is connected to BO. Characters OR1-OR4 denote OR circuits, and characters IV1 and IV3 denote inverters. To the input AI1 of the switch 48, the switches 45 and 47 are connected through the OR circuit OR1. To the input AI2, the output of the switch 47 inverted by the inverter IV1 as well as the switch 45 are connected through the OR circuit OR2. To the input AI3, the switch 45 is connected. Also, to the input BI1 of the switch 49, the switches 46 and 47 are connected through the OR circuit OR3. To the input BI2, the output of the switch 47 inverted by the inverter IV2 as well as the switch 46 are connected through the OR circuit OR4. To the input BI3, the switch 46 is connected.

In FIG. 5, reference numeral 50 denotes a HOM position sensor and represents the position of the ejector Z stage 9 when it operates to bring the chuck surface of the ejector hand 7 into a parallel relation with the chuck surface of the stage 12 for the conveyance, for mounting a wafer 1 to the stage 12, or when it operates to convey the wafer demounted from the stage 12. Reference numeral 51 denotes an MD position sensor and represents the position of the ejector Z stage 9 as assumed when the ejector hand 7 having a wafer mounted to the stage 12 is moved away from the stage 12 or when it moves toward the stage 12 for demounting of a wafer on the stage 12. Reference character WC denotes the position of the ejector Z stage 9 as assumed when the chuck surface of the ejector hand 7 comes into the same plane as the chuck surface of the stage 12. Reference character VL denotes a sensor for detecting whether or not the z-axis position of the ejector hand 7 is close to the position WC, as described. Reference characters L1 and L2 as well as reference characters U1 and U2 denote those positions at which the ejector hand 7 (ejector Z stage 9) stops temporarily for transfer of a wafer between the stage 12 and the ejector hand 7, to be described later in detail. Reference character +EZ (the position denoted at 45) and reference character −EZ (the position at 46) represent the limit sensors in the +z direction and −z direction, respectively. The change-over between "low" and "high" of these switches is effected in accordance with the position of the ejector hand 7, in a manner such as shown in FIG. 5. The switch 47 is set so that the low level and the high level are interchanged between the positions L1 and U2 and between the positions L2 and U1, such that the high level is set when the ejector hand 7 is at the position L1 or U1 while the low level is set when the ejector hand is at the position of L2 or U2.

Referring now to the flow charts of FIGS. 6 and 7, description will be made of the operation of transferring a wafer from the ejector hand 7 to the stage 12, by using the ejector Z stage 9 of the structure described above.

Here, it is assumed that the ejector Z stage 9 is at the HOM position; the ejector hand 7 has been rotated by the actuator 8 so that its chuck surface is placed in parallel to the chuck surface of the stage 12; and that with respect to the x-axis direction it is moved by the X stage 10 of the ejector such that, as described with reference to FIG. 1, the center of the wafer held by attraction is coincident with the center of the chuck surface of the stage 12.

First, referring to FIG. 6, the flow of the wafer transferring operation will be explained. Initially, the ejector Z stage 9 is moved from the position HOM to the position L1, just before the chuck surface of the stage 12, with acceleration/deceleration drive for enhancement of the throughput (step S61). Then, the vacuum attraction of the stage 12 starts (step S62), and the ejector Z stage 9 is moved from the position L1 to the position L2, which is close to the chuck surface of the stage 12 and is at the −z direction side, through constant-speed movement (step S63). Here, by using the vacuum sensor (not shown) of the stage 12, discrimination is made as to whether it is in the condition for attraction (step S64). If the chuck of the stage, 12 is in condition for attraction, the result of the discrimination is affirmative and the vacuum attraction by the ejector hand 7 is stopped (step S67). Then, the ejector Z stage 9 is moved from the position L2 to the position MD, sufficiently spaced from the chuck surface of the stage 12, again through the acceleration and deceleration drive.

On the other hand, if at step S64, the chuck of the stage 12 is not in condition for attraction, the result of the discrimination is negative, and the vacuum attraction by the stage 12 is stopped (step S65), and the ejector Z stage 9 is moved from the position L2 to the position L1 through a constant-speed drive (step S66). Then, the sequence goes back to step S62, and the sequence up to step S64 is repeated by a predetermined number of repetitions until the chuck of the stage 12 is placed in condition for attraction.

Now, step S61 and step S63 of the abovedescribed sequence will be explained in greater detail, by reference to FIGS. 4 and 7.

First, step S61 is for execution of acceleration and deceleration drive of the ejector Z stage 9, which is at the position HOM, to move the same to the position L1. First, the conveyance CPU 20 discriminates that the drive is for moving the stage from the position HOM to the position L1, and it sets necessary drive parameters (e.g. the pulse rates at the time of start and at the time of high-speed movement, the acceleration and deceleration speed, the number of drive pulses, and the direction of motor rotation) in the pulse controller 41 (step S71). Then, the position discrimination before a start of operation, for discriminating that the ejector Z stage 9 is at the position HOM, is effected by using the position sensor 50 (step S72). If the position sensor 50 is not at the high level, the sequence goes to an error routine (not shown). Then, in response to the MOD signal from the conveyance CPU 20, selection of necessary limit sensors is effected. On this occasion, the limit sensor selection is made so that the end limit function of the pulse controller 41 operates in response to the low output of the VL sensor 47, to prevent overrunning of the ejector Z stage 9 from the position L1 which causes collision of the wafer 1 held by the ejector hand 7 against the chuck surface of the stage 12, thus resulting in the dropping of or damage of the wafer. In other words, the mode a is selected to connect, in the switch 49, BI2 to BO to allow that the signal resulting from the "OR" (OR4) between the output of the VL sensor 47 having been inverted by IV2 and the output of the limit sensor 46, is applied to −EL of the pulse controller 41. Here, in the switch 48, AI3 is connected to AO (step S73). Then, a start command is applied to the conveyance CPU 20 to the pulse controller 41 (step S74) and the ejector Z stage 9 starts its movement in accordance with the drive parameters checked at step S71. Subsequently, whether or not the mode re-selected is necessary is checked by the conveyance CPU 20. In this case, it is not necessary and the result of the discrimination at step S75 is negative, whereby step S76 and step S77 are passed. Then, the conveyance CPU 20 reads the status of the pulse controller 41 and discriminates whether or not it is being operated (the pulse POUT is being outputted) (step S78). If it is in operation, the result of the discrimination is affirmative, and the sequence goes back to the discrimination at step S75. If, on the other hand, it is not in operation, the result of the discrimination is negative. Then, at step S79, the position discrimination after operation is effected. Since, however, in this case there is no position sensor at the position L1, this step is actually passed.

Next, description will be made of step S63 which is for moving the ejector Z stage 9 from the position L1 to the position L2 at a constant speed, after start of vacuum attraction by the chuck of the stage 12 (step S62).

First, the conveyance CPU 20 discriminates whether the drive is one being performed from the position L1 to the position L2, and it sets necessary drive parameters in the pulse controller 41, in a similar manner as described (step S71). Then, at step S72, position discrimination before operation is made. Since, however, there is no position sensor at the position L1, this step is actually passed. Then, in response to the MOD signal from the conveyance CPU 20, the selection of necessary limit sensors is effected. In this case, since the mode a (FIG. 4) has been selected at step S61, described hereinbefore, if the ejector Z stage 9 is driven in this mode, the end limit function operates at the position at which the output of the VL sensor 47 changes from the high-level to the low-level, and the ejector Z stage 9 is stopped. In consideration thereof, in this case, the conveyance CPU 20 applies to the switch 49 a MOD signal, selecting the mode c, so as to allow that only the output of the limit sensor 46 is inputted to -EL of the pulse controller 41 of FIG. 4 (step S73). In other words, at the switch 49, BI3 is connected to BO (at switch 49, AI3 is connected to AO). Subsequently, a start command is applied from the conveyance CPU 20 to the pulse controller 41 (step S74), and the ejector Z stage 9 starts its movement in accordance with the drive parameters checked at step S71. Then, whether or not the mode re-selection is to be made or not is checked at step S75. In this case, the result of the discrimination made by the conveyance CPU 20 is affirmative, and the sequence goes to step S76. Here, the ejector Z stage 9 is not stopped at the position WC at which the chuck surface of the stage 12 and the chuck surface of the ejector hand 7 coincide with each other with respect to the z-axis position at the time of wafer transfer to the stage 12, but rather it is moved to the position L2 which is at the −z direction side thereof. If the ejector Z stage 9 is not stopped at the position L2, the wafer held by the ejector hand 7 will be damaged. In consideration thereof, the conveyance CPU 20 operates to execute the mode re-selection after the output of the VL sensor 47 changes from the high level to the low level, between the positions L1 and U2, so that the end limit function operates at a position which is close to and at the −z direction side of the position L2. Thus, the end limit function operates when the level changes from low to high, between the positions L2 and U1. Such mode selection timing is discriminated at step S76, in which whether or not the output of the VL sensor 47 changes from the high level to the low level, is checked. If the output of the VL sensor 47 is at the high level, the result of the discrimination is negative and the sequence goes to discrimination at step S78. Here, as described, the conveyance CPU 20 reads the status of the pulse controller 41 and executes discrimination as to whether it is in operation or not. Initially, as a matter of course, it is in operation and, therefore, the sequence goes back to step S76 through step S75. If the output of the VL sensor 47 is at the low level, the result of the discrimination at step S76 is affirmative, and the mode selection is effected (step S77). That is, the conveyance CPU 20 applies the MOD signal for selecting the mode b to connect BI1 to BO in the switch 49, so as to allow that the signal resulting from the "OR" between the output of the VL sensor 47 and the output of the limit sensor 46 is inputted to —EL of the pulse controller 41. Subsequently, the sequence goes to the discrimination at step S78, and whether or not the ejector Z stage 9 is in operation, is checked. If it is in operation, the result of the discrimination is affirmative and the sequence goes back to step S75. Here, since the mode re-selection has been made, the result of the discrimination is negative and the sequence goes to step S78. If the ejector Z stage 9 stops at the position L2, the result of the discrimination at step S78 is negative and the sequence goes to step S79. Since, however, there is no position sensor at the position L2, this step for the position discrimination after operation is passed.

While step S61 and step S63 have been explained, similar operations are made with regard to step S66 or S68 of FIG. 6.

Also, when a wafer attracted to and held by the chuck of the wafer 12 is to be transferred to the ejector hand 7, similar control is executed with regard to the positions U1 and U2.

In accordance with the present invention, as described hereinbefore, a plurality of position limiting means are provided along the direction of conveyance and, in accordance with the target position of the conveyance, effective position limiting means is or are selected out of the plural position limiting means before a start of conveyance. After the start of conveyance, in accordance with the state of the position limiting means or position discriminating means, effective position limiting means is or are selected again. As a result, even if malfunction of the conveying apparatus occurs, the article being conveyed or the conveying apparatus itself is not damaged. Also, dropping of the article being conveyed is prevented. Accordingly, the reliability of the conveying apparatus is improved significantly.

Further, with the present invention, it is possible to improve the reliability similarly as described, even in such a conveying apparatus as having a small stroke so that many position limiting means cannot be provided.

While the invention has been described with reference to the structures disclosed herein, it is not confined to the details set forth and this application is intended to cover such modifications or changes as may come within the purposes of the improvements or the scope of the following claims.

What is claimed is:

1. A conveying device comprising:
   a conveying mechanism including a movable member for conveying an article along a direction of conveyance;
   a first detector disposed at a first position and a second detector disposed at a second position, different from the first, the first and second detectors respectively being disposed along the direction of conveyance of the article;
   selecting means for selecting said first detector for a first portion of the movement of said movable member along the direction of conveyance, toward the first position, and for selecting said second detector for a second portion of the movement of said movable member when, in the first portion of the movement, said movable member comes close to the first position; and
   limiting means for limiting the movement of said movable member on the basis of an output of the one of said first and second detectors selected by said selecting means, whereby said first detector and said second detector each comprise an end limit switch.

2. A conveying method for conveying an article along a direction of movement of a movable member, said method comprising the steps of:
   providing a first detector at a first position and a second detector at a second position, different from the first, the first and second detectors respectively being disposed along the direction of movement of the movable member;
   selecting the first detector, in accordance with an output of the first detector, for limiting movement of the movable member in a first portion of movement; and
   selecting the second detector, in accordance with an output of the second detector, for limiting movement of the movable member in a second portion of the movement, based on a current position of the movable member, whereby the first and second detectors each comprise an end limit switch.

3. A conveying device, comprising:
   a movable member;
   a driving mechanism for moving said movable member;
   first and second detectors disposed along the direction of movement of said movable member, wherein said first detector is closer to a movement start position of said movable member than said second detector, each of said first and second detectors serving as a switch for controlling the operation of said driving mechanism;
   control means for rendering said first detector operable as an operation controlling switch when said movable member is in a first portion of its stroke including the movement start position, and for rendering said first detector inoperable as the operation controlling switch when said movable member is in a second portion of its stroke, different from the first portion; and
   limiting means for limiting the operation of said driving means on the basis of an output of the operation controlling switch.

4. A device according to claim 3, wherein said driving mechanism includes a single drive source for moving said movable member.

5. A device according to claim 3, wherein the operation controlling switch functions as an end limit switch.

6. A device according to claim 5, wherein said limiting means stops the operation of said driving mechanism in response to an output of said end limit switch.

7. A method of conveying a movable member by controlling first and second detectors each being operable as a switch for controlling operation of a driving mechanism for moving the movable member, the first and second detectors being disposed along the direction of movement of the movable member so that the first detector is closer to a movement start position of the movable member than the second detector, the method comprising the steps of:
   rendering the first detector operable as an operation controlling switch when the movable member is in a first portion of its stroke including the movement start position, and rendering the first detector inoperable as the operation controlling switch when the movable member is in a second portion of its stroke, different from the first portion; and limiting the operation of the driving mechanism on the basis of an output of the operation controlling switch.

8. A method according to claim 7, further comprising the step of moving the movable member with a single drive source of the driving mechanism.

9. A method according to claim 7, wherein the operation controlling switch functions as an end limit switch.

10. A method according to claim 9, wherein said limiting step comprises the step of stopping the operation of the driving mechanism in response to an output of the end limit switch.

* * * * *

UNITED STATES PATENT AND TRADEMARK OFFICE
CERTIFICATE OF CORRECTION

PATENT NO. : 5,226,523
DATED : July 13, 1993
INVENTOR(S) : KAWAKAMI ET AL.

It is certified that error appears in the above-indentified patent and that said Letters Patent is hereby corrected as shown below:

AT [57] ABSTRACT

Line 4, delete "or".
    Line 7, delete "or".

Column 3

Line 42, "delete "or".
    Line 48, change "runway" to --runaway--.

Column 6

Line 51, delete "in".

Column 7

Line 3, change "stage, 12" to --stage 12--.
    Line 20, change "abovedescribed" to --above-described--.

Signed and Sealed this

Third Day of May, 1994

Attest:

BRUCE LEHMAN

Attesting Officer     Commissioner of Patents and Trademarks